(12) United States Patent
Dawson et al.

(10) Patent No.: US 11,233,017 B2
(45) Date of Patent: Jan. 25, 2022

(54) EX-SITU MANUFACTURE OF METAL MICRO-WIRES AND FIB PLACEMENT IN IC CIRCUITS

(71) Applicant: Texas Instruments Incorporated, Dallas, TX (US)

(72) Inventors: Michael Lee Dawson, McKinney, TX (US); Edward J. Pryor, III, Royse City, TX (US); Jeffrey L. Large, Richardson, TX (US); Mary Coles, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 17 days.

(21) Appl. No.: 16/592,102

(22) Filed: Oct. 3, 2019

(65) Prior Publication Data

US 2021/0104474 A1 Apr. 8, 2021

(51) Int. Cl.
| | | |
|---|---|---|
| *H01L 23/64* | (2006.01) | |
| *H01L 49/02* | (2006.01) | |
| *H01Q 1/22* | (2006.01) | |
| *H01L 23/66* | (2006.01) | |

(52) U.S. Cl.
CPC ............ *H01L 23/645* (2013.01); *H01L 23/66* (2013.01); *H01L 28/10* (2013.01); *H01Q 1/2283* (2013.01)

(58) Field of Classification Search
CPC ....... H01L 23/645; H01L 23/66; H01L 28/10; H01L 2223/6611; H01Q 1/2283; H01Q 9/42
USPC .................................. 257/531, 528; 438/329
See application file for complete search history.

(56) References Cited

U.S. PATENT DOCUMENTS

| | | | |
|---|---|---|---|
| 2015/0085456 A1* | 3/2015 | Cok ...................... | H05K 1/0274 361/767 |
| 2019/0393585 A1* | 12/2019 | Tamagawa et al. . | H01Q 1/2283 |

* cited by examiner

*Primary Examiner* — Thinh T Nguyen
(74) *Attorney, Agent, or Firm* — Valerie M. Davis; Charles A. Brill; Frank D. Cimino (57) ABSTRACT

An integrated circuit package includes a first conductive element that is fabricated as part of the integrated circuit package and a micro-wire having a first end coupled to the first conductive element. The micro-wire has been fabricated ex-situ and is of a metal having a diameter of 10 microns or less.

7 Claims, 9 Drawing Sheets

260 — WELD A FIRST END OF THE MICRO-WIRE TO A FIRST CONDUCTIVE ELEMENT ON AN IC CHIP AND WELD A SECOND END OF THE MICRO-WIRE TO A SECOND CONDUCTIVE ELEMENT ON THE IC CHIP

FIG. 2B

265 — SHAPE THE MICRO-WIRE TO ARCH OVER A THIRD CONDUCTIVE ELEMENT BETWEEN THE FIRST CONDUCTIVE ELEMENT AND THE SECOND CONDUCTIVE ELEMENT WITHOUT TOUCHING THE THIRD CONDUCTIVE ELEMENT

FIG. 2C

270 — SHAPE THE MICRO-WIRE FOR ATTACHMENT BETWEEN A FIRST BOND PAD ON A FIRST IC CHIP AND A SECOND BOND PAD ON A SECOND IC CHIP

275 — WELD A FIRST END OF THE MICRO-WIRE TO THE FIRST BOND PAD AND WELD A SECOND END OF THE MICRO-WIRE TO THE SECOND BOND PAD

FIG. 2D

280 — SHAPE THE MICRO-WIRE TO FORM AN ANTENNA

FIG. 2E

285 — SHAPE THE MICRO-WIRE TO FORM A MICRO-INDUCTOR

EX-SITU MANUFACTURE OF METAL MICRO-WIRES AND FIB PLACEMENT IN IC CIRCUITS

BACKGROUND

In the early stages of production and evaluation of a semiconductor integrated circuit (IC) chip, "circuit edit" is a practice commonly used to effectively reduce development cycle-time and time to market by cutting existing couplings or adding new couplings to an existing IC chip. Circuit editing can provide rapid prototype modification, e.g., performing modifications in hours or days. These same modifications may take weeks of time to process through a semiconductor fabrication plant, because there is often the need to produce or modify costly masks sets. Whereas techniques for performing circuit edits address many of the ongoing challenges, several lacunae continue to exist with regard to establishing some types of new connections.

SUMMARY

Disclosed embodiments provide methods of fabricating micro-wires and of placing the micro-wires in IC chips and circuit packages using an apparatus that employs any of a focused ion beam (FIB) microscope, a combination of FIB with scanning electron microscope (SEM), plasma FIB microscope, or similar microscope. The micro-wires can be used during development to enhance the capabilities of the FIB apparatus in types of circuit edits that are currently difficult or impossible. Using the FIB apparatus, the micro-wires can also be incorporated into the production of IC chips and packages. Although developed for use with IC chips, the disclosed methods and devices can also be utilized in circuits that are not part of ICs.

In one aspect, an embodiment of an IC package is disclosed. The IC package includes a first conductive element fabricated as part of the IC package; and a micro-wire having a first end coupled to the first conductive element, the micro-wire having been fabricated ex-situ and comprising a metal having a diameter of 10 microns or less.

In another aspect, an embodiment of a method of fabricating an integrated circuit package having a micro-wire formed of metal is disclosed. The method includes mounting a micro-wire for transport, the micro-wire being formed of a metal and having a diameter of 10 microns or less; introducing the mounted micro-wire and the circuit package into a focused ion beam (FIB) apparatus that comprises a FIB microscope and a nanopositioner; bringing the micro-wire, the nanopositioner and the circuit package into a work area for the FIB apparatus; using the nanopositioner to bring the micro-wire and the circuit package together at a location for attachment; welding the micro-wire into position; and releasing the micro-wire.

In yet another aspect, an embodiment of a method of fabricating a micro-wire is disclosed. The method includes suspending a section of preformed wire in an etchant solution having a known concentration and temperature for a period of time to achieve a diameter of 10 microns or less, the preformed wire comprising a conductive metal; removing the etched wire from the etchant solution; and rinsing the etched wire.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

IC circuit edits demand precision to modify the small interconnects inside the device without inadvertently affecting nearby structures. Circuit edit on currently developing chips requires a FIB microscope with a precision motorized stage, a high vacuum chamber, specific gas chemistries, i.e., precursor gases, and computer aided drafting (CAD) navigation to locate targeted interconnects which are located subsurface and cannot be seen until exposed. Using a combination of precursor gases and ion beam scanning, these FIB microscopes are able to perform selective etching and deposition.

Figure 5:
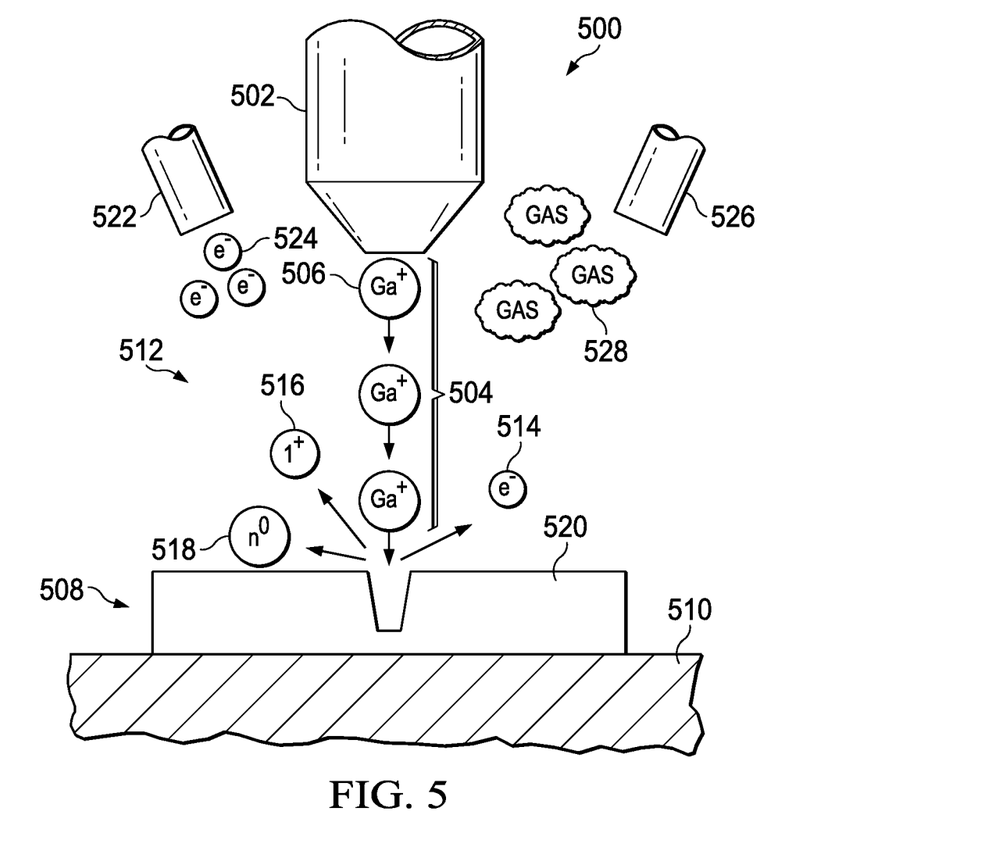
FIG. 5 depicts a dual beam FIB microscope and SEM that can be utilized in fabricating an IC chip containing a micro-wire made of a metal.

Referring now to FIG. 5, a side view is shown of an FIB apparatus 500 in operation. The centerpiece of the FIB apparatus 500 is the primary ion column 502, which generates an ion beam 504 from a liquid metal ion source— typically gallium. Positively charged gallium ions (Ga$^+$) 506 are drawn off a field-emitter point source and accelerated by the application of a large potential, generally in the 30-50 kilovolt (kV) range. With the aid of electrostatic lenses, the emission is focused into ion beam 504, which typically has a sub-micron diameter. The ion beam 504 can be used to mill through a sample 508 that can be an integrated circuit, as may be required in failure analysis. The sample 508 is usually positioned on a stage 510 inside a vacuum chamber 512.

Typically, secondary electrons 514, secondary ions (I$^+$ or I$^-$) 516, and neutral molecules and atoms 518 are ejected from the sample surface 520 when the ion beam 504 impacts the sample 508. The charged particles are drawn toward an electrically-biased grid and collected by a detector (not shown) that is generally positioned at an angle from the ion column 502. The signal from the ejected particles may be amplified and displayed to provide a real-time image of the area of interest.

Dual-column tools may have an ion column 502 complemented by an optional electron column 522, which is typically inclined 45-60 degrees from the ion column 502. The electron column 522 delivers a flood of electrons 524 to the local area and performs SEM imaging for the FIB apparatus 500, providing an image generally superior to that formed by the ion column 502 alone and helping to provide an increased depth of field. Electron column 522 may also aid in cross sectioning and transmission electron microscope (TEM) sample preparation, due to the ease of imaging the milling area.

The ion beam 504 is generally moved across the sample 508 in a single-direction raster or in a user-defined pattern. The operator has control over various parameters, such as beam current, spot size, pixel spacing, and dwell time. The dose, or amount of gallium ions 506 striking the sample surface, is generally a function of the beam current, duration of scan, and the area scanned. The secondary yield, which is the number of secondary ions 516 per gallium ion 506 directed at the sample, is a function of the material being milled. The amount of surface material of the sample 508 sputtered away by the ion beam 504 is a function of all the above-mentioned parameters.

While the ion beam 504 typically has a sputtering effect on the sample materials, there is often a need to add gases to assist in chemically removing material, thereby enhancing the material removal process. Gas-assisted etching is a common feature in modern FIBs. An optional gas injection column 526 delivers a localized deposition gas 528 to the area to be milled. This deposition gas 528 can interact with the ion beam 504 to provide selective gas-assisted chemical etching. Alternatively, the primary ion beam can be used to decompose the gas to provide selective deposition of conductive or insulating materials on the sample.

Semiconductor device modification can be facilitated by the FIB by directing the ion beam at a localized area of the modification to be performed. The ion beam removes material in the local area, milling through the various layers. When the layer of interest is reached, circuit edits can be performed by depositing a new metal line or other material in a desired location to establish a connection, or by cutting through an existing conductive line to sever a connection. Traditionally, in order to create a conductive connection inside the FIB, an organometallic precursor containing, e.g., platinum is injected into the chamber aimed at targeted area, e.g., two or more conductive contact points, and the ion beam scans a pattern on the surface of the device, causing decomposition of the precursor gas and resulting in deposition onto the device. Other precursor gases can include tungsten hexacarbonyl (W(CO)$_6$), as well as organometallic gases that include aluminum (Al), copper (Cu), molybdenum (Mo), etc.

Figure 6A:
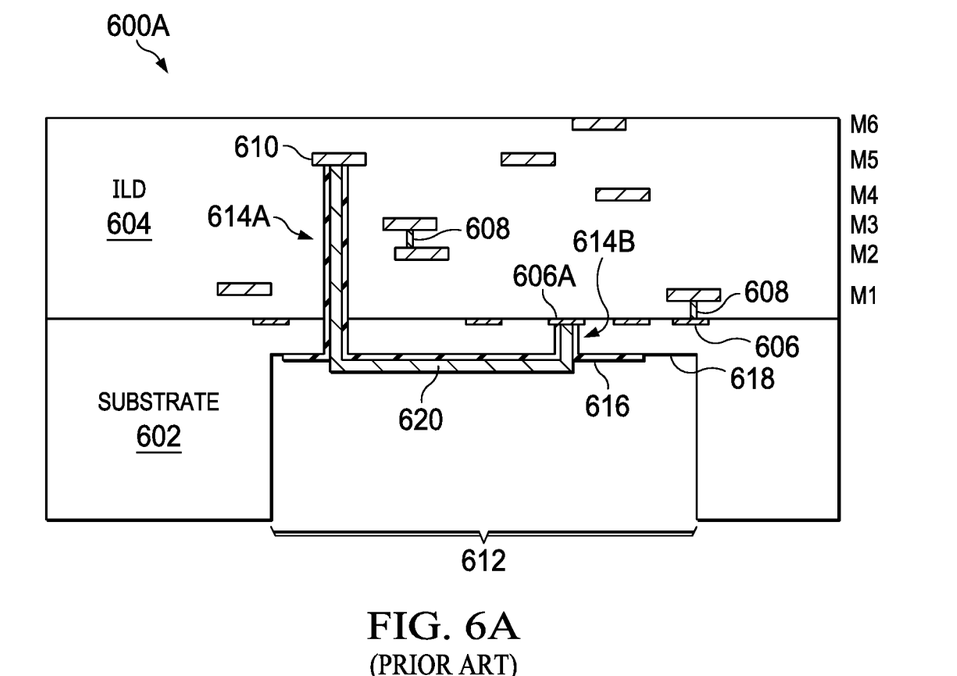
FIG. 6A depicts an example of a circuit edit that the FIB of FIG. 5 can perform.

A FIB apparatus can perform a circuit edit on a device using an approach through either the backside of the substrate or else through the dielectric layer encompassing the metal layers. The best approach may depend on the layout of the device and obstacles that lie between the surface and desired conductive elements. FIG. 6A depicts an example of a circuit edit performed through the backside of IC chip 600A in which the FIB apparatus provides a new connection. IC chip 600A includes a substrate 602 and inter-level dielectric (ILD) 604. Substrate 602 contains conductive regions 606, which are doped silicon and may form, for example, a source, a drain or a well associated with a circuit. ILD 604 contains metal layers M1 through M6, which can be connected by vias 608.

For the circuit edit shown, a new connection is being created between conductive region 606A in the substrate and conductive element 610, which is part of metal layer M5. Using the FIB apparatus, a trench 612 has been milled in substrate 602 to expose the region of interest. Additionally, trench 614A and trench 614B have been milled to contact conductive element 610 and conductive region 606A respectively. Because these trenches traverse a portion of substrate 602, the new connection needs to be insulated from the substrate. This can be accomplished by depositing a dielectric layer, e.g., silicon oxide 616, which can fill the trenches 614A and 614B, as well as extending across a portion of the bottom 618 of trench 612. The FIB can then mill through the silicon oxide 616 that fills trench 614A and trench 614B while leaving a layer of silicon oxide on the walls of these trenches. The FIB then deposits a conductive material 620 into trench 614A and trench 614B, as well as forming a conductive connection between the two trenches 614A, 614B.

Figure 6B:
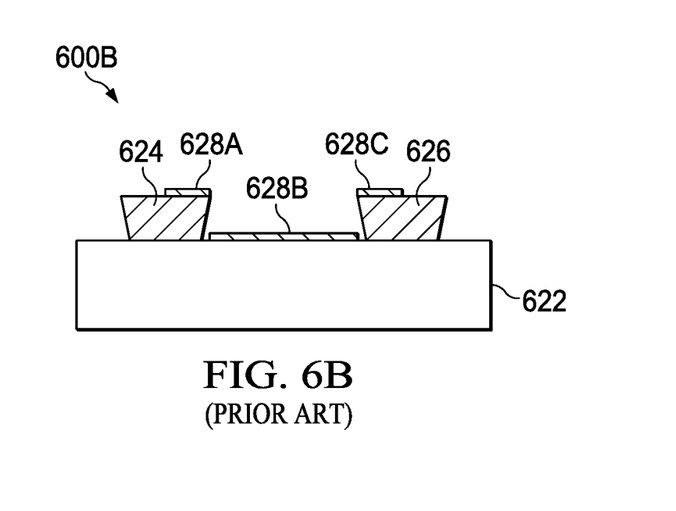
FIG. 6B depicts an example of a circuit edit that the FIB of FIG. 5 is unable to perform.

While the circuit edit shown in FIG. 6A is well within the capabilities of current FIB apparatus 500, it is not currently possible for a FIB to perform other desired edits, such as forming a conductive connection between two conductive elements that are elevated above the surface, such as a bond over active circuit (BOAC) or top copper elements. FIG. 6B depicts an IC chip 600B that contains dielectric layer 622, top copper element 624 and top copper element 626. In this example, it is desirable to form a new connection between top copper element 624 and top copper element 626 without first depositing a dielectric between the top copper elements. However, because the depositions are made from gases and the conductive elements 624, 626 contain overhangs, it is not possible to provide a connection across the gap between top copper element 624 and top copper element 626. Instead, an attempt to deposit the connection would result in discontinuous sections 628A, 628B and 628C as shown.

Another problem that can arise with conductive elements formed in the FIB occurs as a result of the method used to volatilize the metal conductive element. The metals used for vapor deposition of a connection in a FIB, e.g., platinum, tungsten or molybdenum, are not very volatile, so in order to use these metals, they are typically enclosed in a "cage" of carbon to enhance volatility. In one embodiment, (trimethylcyclopentadienal) trimethyl platinum ($C_9H_{17}Pt$) is the precursor gas used to deposit platinum. The resulting deposited platinum contains large amounts of carbon, which increases the resistivity of the connection. A typical connection deposited by the FIB has a resistivity of about 20 ohms/micron. This means that a traditional FIB connection having a length of 90 μm and a width of 1 μm can have a resistance of about 1800 ohms. By increasing the width to 2 μm, the resistance can be dropped to about 900 ohms, but remains high. This creates a problem when the new connection is required to carry a high current, as the current can burn out the connection. New operations that can be performed in the FIB are needed to address these problems.

The present application discloses a method of fabricating micro-wires, e.g., having diameters of a few microns or even smaller, and using these micro-wires to coupled conductive elements on IC chips. Electrochemical etching is a known method of reducing the diameter of a wire and has been used in the production of very small, sharp tips for use in many processes, e.g., scanning tunneling microscopy. Applicants have adapted chemical etching of a wire to provide micro-wires having diameters of 10 μm or less. Once prepared, these micro-wires can be used in performing circuit edits on integrated circuit chips. In addition to their use in solving identified shortcomings in existing FIB processes, methods of using the disclosed micro-wires in the production of IC chips is also identified. Additionally, although the disclosed concepts were developed for use in ICs, their use is not limited to ICs as will be further explained below.

Figure 1:
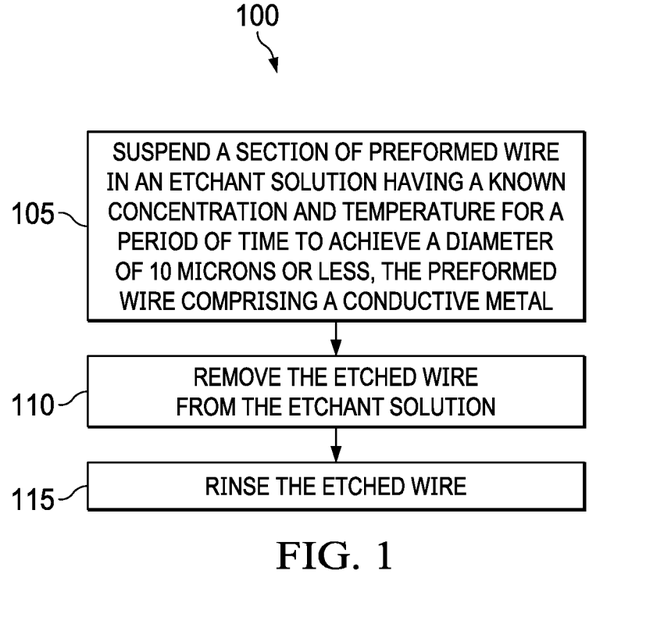
FIG. 1 depicts a method of fabricating a conductive micro-wire according to an embodiment of the disclosure.

FIG. 1 depicts a flowchart of a method 100 for fabricating a micro-wire that can be utilized in circuit edits and can also be utilized in the production of finished packages. The method is currently a manual process that has been shown to provide an even etch of the wire. The manual method is described herein to provide proof of the concept but is not intended as a limitation of the method. Method 100 begins with suspending 105 a section of preformed wire in an etchant solution having a known concentration and temperature. The preformed wire, which comprises a conductive metal such as tungsten, copper, aluminum, etc., remains in the etchant solution for a period of time that will achieve a diameter of 10 microns or less. In one embodiment, the preformed wire is tungsten and has an initial diameter of 1 mil.

Testing was performed to determine an appropriate concentration and time period to achieve the desired results. Various segments of tungsten wire having a diameter of 1 mil were then suspended in a 30% solution of hydrogen peroxide at 110° C. for periods of about 30 minutes, plus or minus one minute, and achieved micro-wires having respective diameters ranging from 1 μm to 6 μm. The actual time necessary will depend on the metal composition and initial diameter of the preformed wire, the etchant and etchant concentration and the temperature of the solution. Several examples of other metals and respective etchants that may be used include diluted nitric acid to etch a copper wire and diluted hydrochloric acid to etch an aluminum wire. Once the determined period of time has elapsed, the method continues with removing 110 the etched wire from the etchant solution. The etched wire is then rinsed 115 to completely halt any etching action.

Figure 1A:
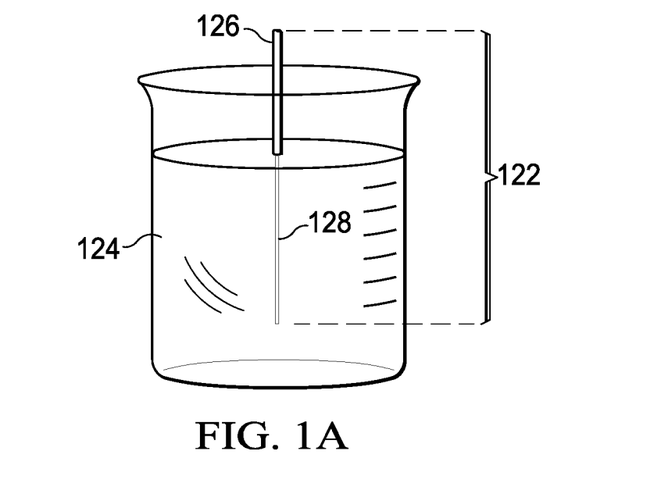
FIG. 1A depicts a section of preformed wire that is being etched to form a micro-wire according to an embodiment of the disclosure.

FIG. 1A depicts an example of a wire during etching to form a micro-wire. This figure is not drawn to scale and is provided solely to illustrate the general idea. A preformed wire 122 has been suspended in an etchant solution 124 using a holder that is not specifically shown. After a period of etching, preformed wire 122 includes two segments: first segment 126 remains above the etchant solution and is not affected by etching and second segment 128 is immersed in etchant solution 124 and will have a diameter that decreases over time. Etchant solution 124 is maintained at a selected temperature, although again the apparatus is not specifically shown. Although the first segment 126 retains its diameter and visibility, as second segment 128 approaches a final diameter of 10 μm or less, second segment 128 will no longer be visible to the naked eye and can only be seen under magnification. Since the micro-wire is to be transported to a FIB chamber for use, segment 126 may remain attached for handling of wire 122 during transport. It may further be desirable to limit the length of the preformed wire 122 to a length that can be manipulated within the FIB chamber. Current FIB chambers generally have a size that can generally be measured in a few hundreds of millimeters, so that a micro-wire having a length of a few millimeters can be provided.

Figure 2:
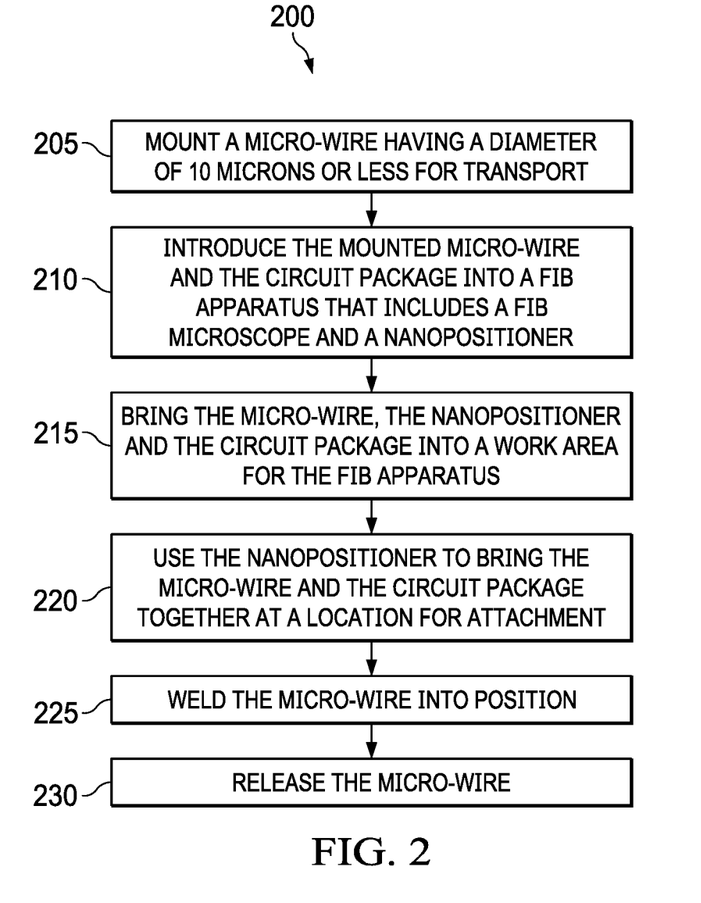
FIG. 2 depicts a method of fabricating an circuit package according to an embodiment of the disclosure.

FIG. 2 depicts a flowchart of a method 200 of fabricating a circuit package according to an embodiment of the disclosure. The circuit package may contain a single IC chip, multiple IC chips that are attached together, e.g., a multichip module. For purposes of this application, reference to an IC chip will be understood to include an IC chip that is part of an IC package or circuit package. It can be noted that an IC package or circuit package can include but is not limited to the elements shown in FIGS. 3A-3C and 4A-4F. The circuit package may also contain a chip coupled to a device where the device is a non-IC electrical component or circuit, or a device coupled to a device. The circuit package may be in the process of being fabricated or may be in the process of development and/or debugging of the design, with a circuit edit being performed. When a circuit edit is being performed, one or more regions of the circuit package may have been previously exposed, e.g., using the FIB apparatus to remove material and expose one or more conductive elements. The conductive elements may include but are not limited to bond pads, vias, wires, metal layers, components, etc. The circuit package may also be part of a research application, include microelectromechanical (MEMs) devices, etc.

Method 200 starts with mounting 205 a micro-wire having a diameter of 10 μm or less for transport. In one embodiment, the micro-wire has been formed using method 100 of FIG. 1. In one embodiment, the micro-wire is mounted to a substrate that provides a stable means of holding the micro-wire for introduction into the FIB chamber; the substrate can be formed of any material suitable to that purpose. In one embodiment, the micro-wire is placed within a receptacle, e.g., a cradle from which the micro-wire can be picked up within the FIB. In one embodiment, the entire wire has a diameter of 10 microns or less. In one embodiment, a first section of the wire has a diameter of 10 microns or less and a second section of the wire has a larger diameter that can more easily be secured.

The mounted micro-wire and the circuit package are introduced 210 into a FIB apparatus that includes a FIB microscope, which may be a plasma FIB microscope, and a nanopositioner. In some embodiments, the FIB apparatus also includes a scanning electron microscope. Although not required, a SEM provides a separate view of the internal work area and improves the ability to locate items such as the micro-wire within the three dimensions of the FIB chamber. Nanopositioners are highly precise motion devices that are capable of positioning samples with nanometer accuracy. Nanopositioners were initially introduced in FIB chambers for use in TEM sample preparation, but can be repurposed for the manipulation of micro-wires. For purposes of this application, reference to nanopositioners is interpreted to include micro-grippers, MEMS devices, devices that use static electrical forces, etc., as well as methods of self-assembly or self-alignment. The FIB chamber is further coupled to provide a high vacuum and includes high energy sources, a detector for visualization, and multiple chemistries that can be employed to either perform milling or deposition as noted earlier.

The micro-wire, the circuit package and the nanopositioner are then brought 215 into a work area for the FIB apparatus and the nanopositioner is used 220 to bring the micro-wire and the circuit package together at a location for attachment. In one embodiment, the micro-wire can be held stationary while the circuit package is manipulated to bring the two into contact. In one embodiment, the micro-wire can be picked up by a micro-gripper that is part of the nanopositioner and placed precisely on the circuit package. The micro-wire can also be placed very precisely using a nanopositioner that comprises only an elongated tip; this process will be discussed below. Once positioned, the micro-wire section is welded 225 into position using one or more welds. In one embodiment, the welds are made using the precursor gas (trimethylcyclopentadienal) trimethyl platinum to deposit a short strap of platinum across the micro-wire. Once the micro-wire is fastened in place, the micro-wire can be released 230 from a device that is holding or attached to the micro-wire.

Figure 2A:
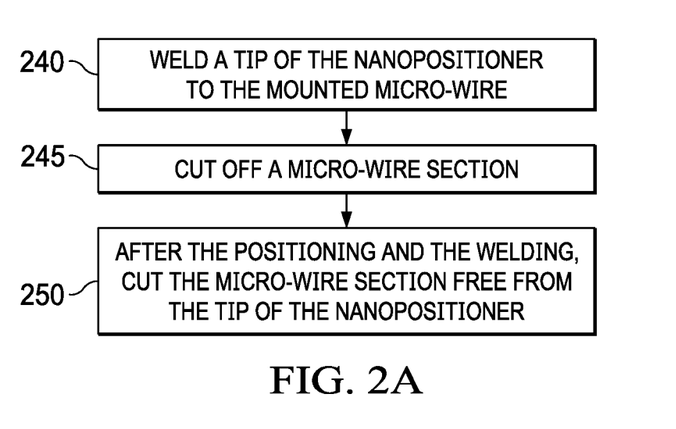
FIGS. 2A-2F depict additional elements that may be part of the method of FIG. 2.

As noted above, in one example embodiment, the nanopositioner includes an elongated tip to which the micro-wire must first be attached. Additional elements for this method are shown in FIG. 2A. The tip of the nanopositioner is welded to the micro-wire. In the context of a FIB apparatus, the term weld is used to describe a process to create a physical and/or electrical connection and can be achieved by depositing a small amount of one of the available chemistries that will adhere to both the nanopositioner and to the micro-wire. The weld can be positioned such that the attachment is within a portion of the micro-wire that will be placed in position on an IC chip. A section of the micro-wire is then cut off 245 for use. After the positioning 220 and the welding 225 are completed, the micro-wire section can be released 230 by cutting the micro-wire section free 250 from the tip of the nanopositioner.

Figure 3A:
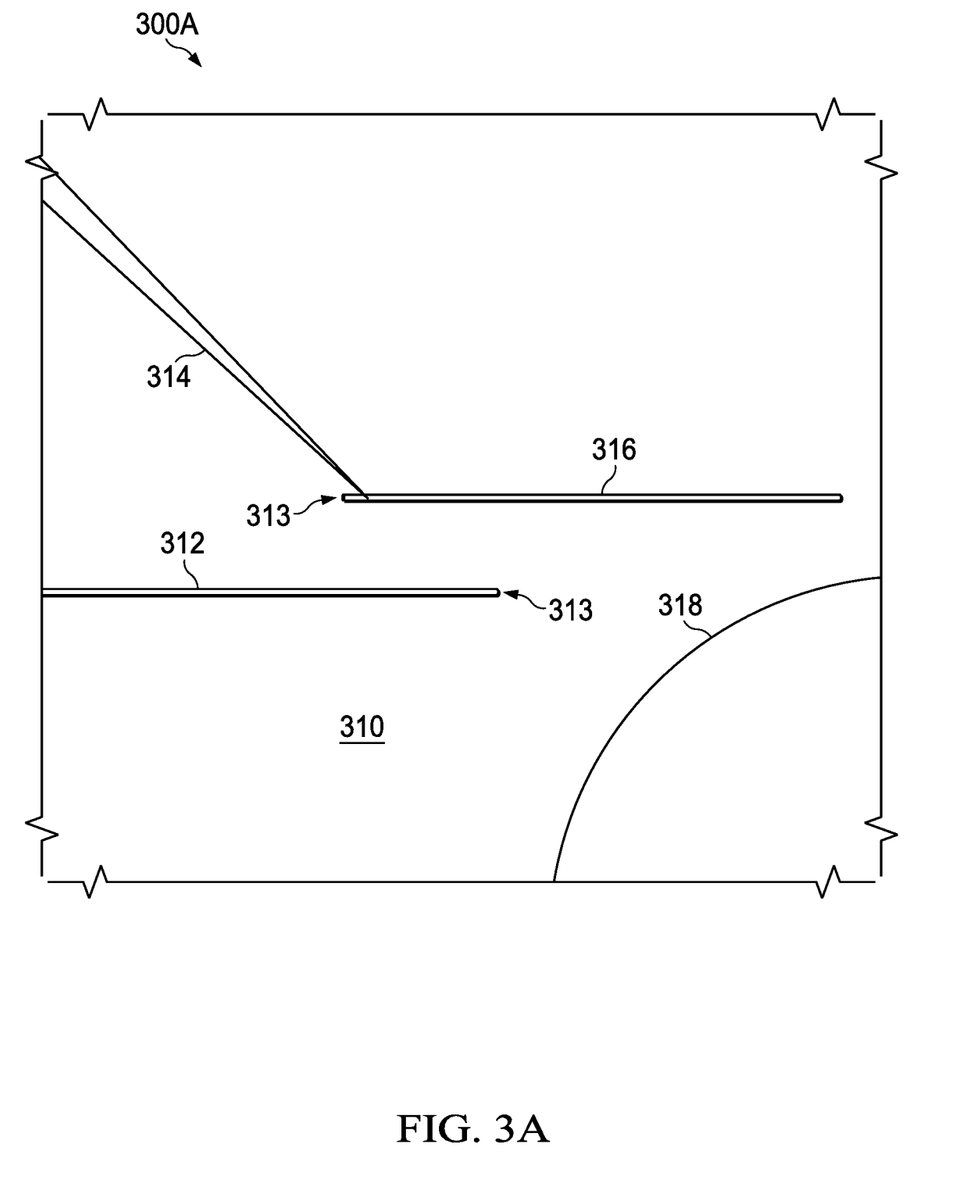
FIG. 3A depicts a micro-wire that has been attached to the tip of a nanopositioner according to an embodiment of the disclosure.

FIG. 3A is a drawing of an ion beam view of a work area 300A that demonstrates a portion of the method of FIG. 2A. Substrate 310 is seen in the background with the attached micro-wire 312. Nanopositioner tip 314 was originally welded to a section of micro-wire 312 that was then cut free to form micro-wire section 316. Arrows 313 point to the locations on micro-wire 312 and micro-wire section 316 where the cut was made. Also shown in FIG. 3 is a nozzle 318 that is part of the gas injection system. For comparison, nozzle 318 is about a millimeter in diameter. In one embodiment, the nanopositioner is an Oxford Instruments Nano-Manipulator.

Figure 3B:
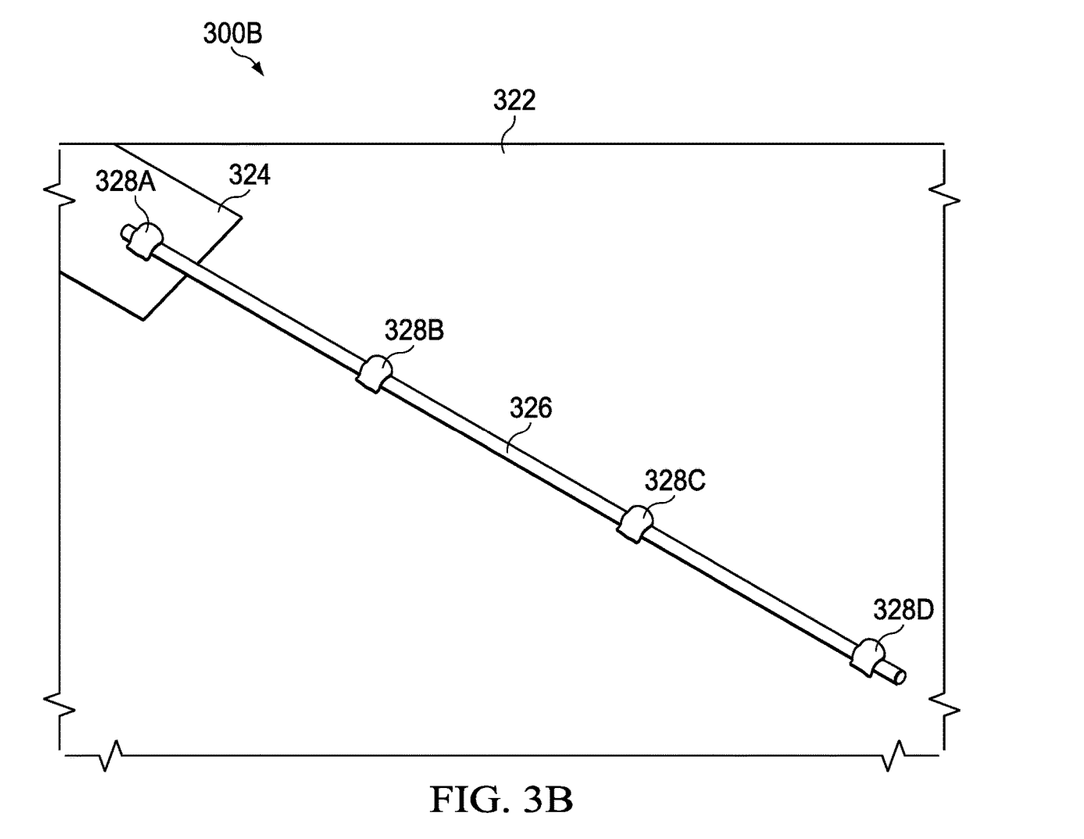
FIG. 3B depicts a micro-wire attached to the surface of an IC chip according to an embodiment of the disclosure.

FIG. 3B is a further drawing of the work area 300B of the FIB chamber after method 200 has been completed. As seen in work area 300B, IC chip 322 contains a bond pad 324. A micro-wire section 326 has been attached to bond pad 324 using a platinum weld 328A. Additional platinum welds 328B, 328C, 328D have also been added to further secure micro-wire section 326. Micro-wire section 326 is about 500 µm long and about 1 µm in diameter. Although micro-wire 326 is not shown attached to a second conductive element, the ability to place and attach externally-created micro-wires on an IC chip is clearly demonstrated by FIG. 3B. In this embodiment, the resistance on micro-wire 326 measured 1.6 ohms over a length of 90 µm using the 4-point Kelvin measurement method; this resistance is two orders of magnitude better than the resistance using a FIB deposition method.

Figure 2B:
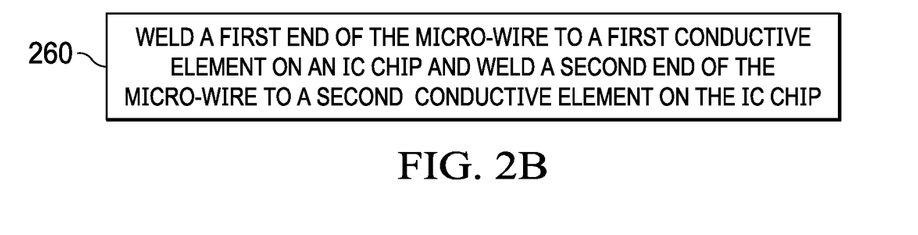

FIGS. 2B-2F each illustrate either elements that further expand on elements of method 200 or else additional elements that may be part of method 200. Each of these additional elements is discussed in conjunction with FIGS. 4A-4F, which depict a number of ways in which the disclosed micro-wire can be utilized to form a new connection during circuit edit or as a regular part of a production circuit package. In FIG. 2B, the element of welding 225 the micro-wire segment into position is expanded to clarify that a first end of the micro-wire segment is welded 260 to a first conductive element on the IC chip and a second end of the micro-wire segment is welded to a second conductive element on the IC chip. Although only two conductive elements are coupled in this example, multiple conductive elements can be coupled together using one or more micro-wires.

Figure 4A:
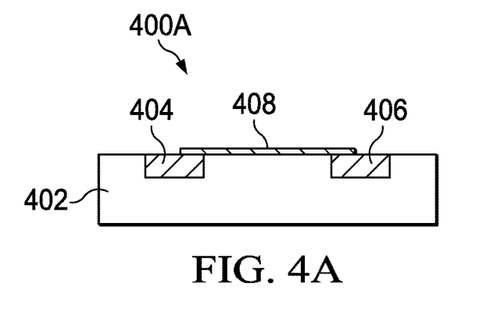
FIG. 4A depicts a micro-wire that couples two embedded conductive elements provided at a surface of an IC chip according to an embodiment of the disclosure.

The simplest example of element 260 is shown in FIG. 4A, which depicts a cross-section of an IC chip 400A containing a micro-wire segment 408 that is attached to a first conductive element 404 and a second conductive element 406 by conductive welds (not specifically shown). The first conductive element 404 and the second conductive element 406 may be, e.g., bond pads or segments of a metal layer that are both embedded in an inter-level dielectric 402. While this type of circuit edit is within the capabilities of current FIB techniques, a micro-wire attached in the disclosed manner can provide a much lower resistance and is able to conduct a larger current than a connection using, e.g., platinum deposited in the FIB. In one embodiment, this example can be reserved for specific circuit edits that require the lower resistance and current-carrying capabilities.

Figure 4B:
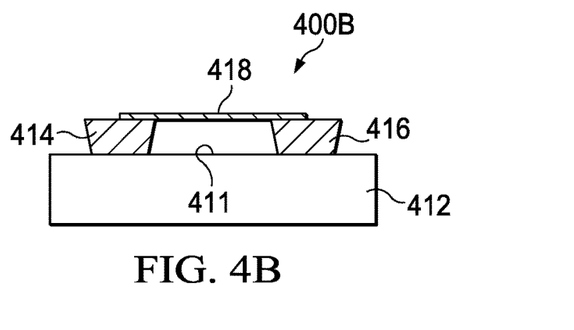
FIG. 4B depicts a micro-wire that couples two conductive elements provided on top of the inter-level dielectric of an IC chip according to an embodiment of the disclosure.

Another example is shown in FIG. 4B, which depicts a cross-section of an IC chip 400B. IC chip 400B includes a first conductive element 414 and a second conductive element 416 that are elevated above the surface 411 of IC chip 400B. First conductive element 414 and second conductive element 416 can be part of a top copper layer or a BOAC layer formed on top of the inter-level dielectric 412. Both the height and the undercut sides of first conductive element 414 and second conductive element 416 make forming a connection using deposited metals impossible without first depositing a dielectric between the two conductive elements, as demonstrated in FIG. 6B. However, micro-wire segment 418 is stiff enough to bridge between the first conductive element 414 and the second conductive element 416.

Figure 2C:
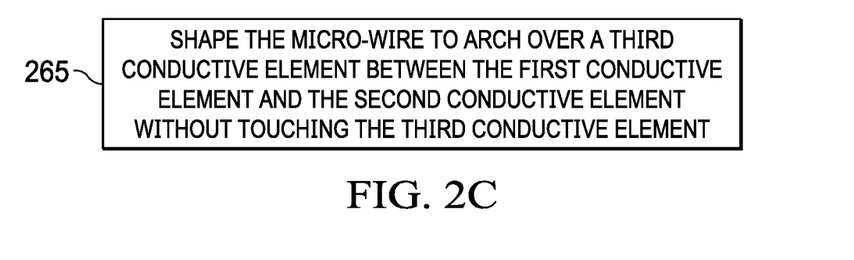
Figure 3C:
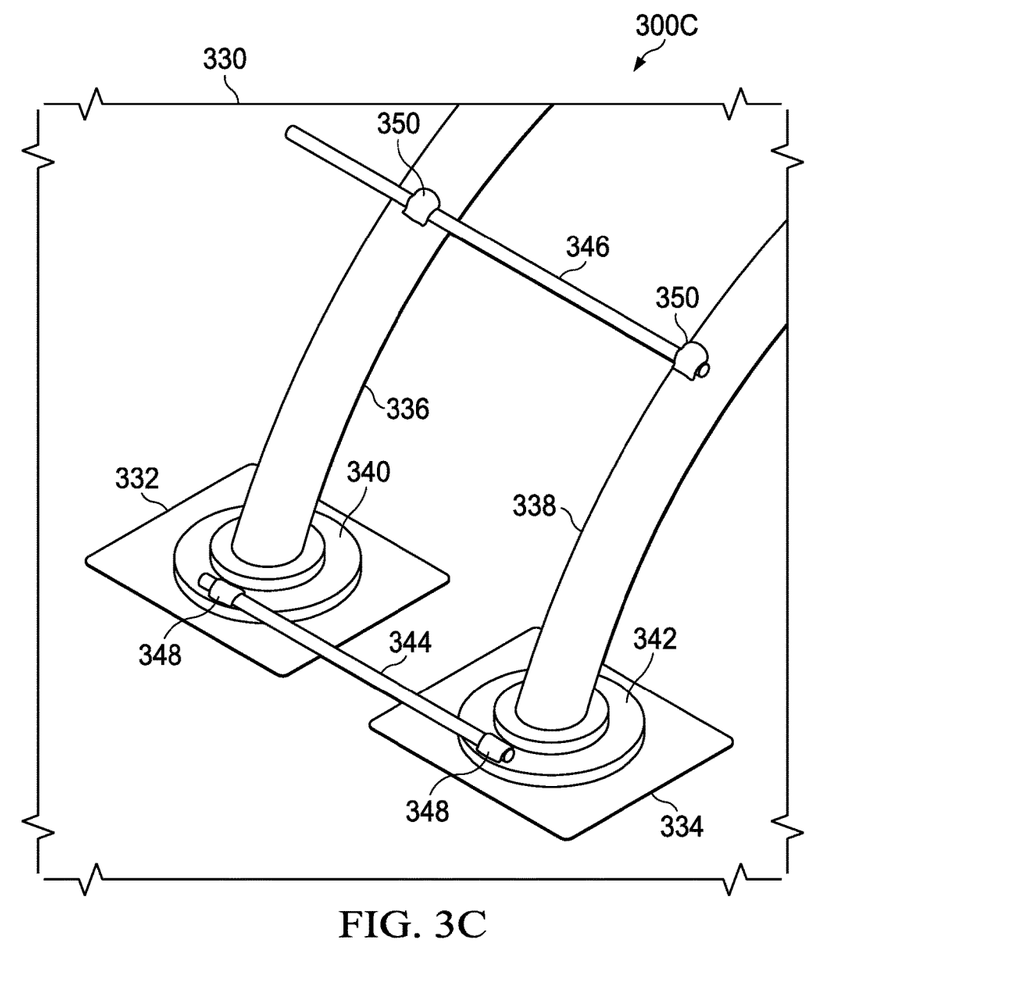
FIG. 3C depicts two micro-wires attached to a circuit package according to an embodiment of the disclosure.

An example of micro-wires that have been added to provide both surface coupling and elevated coupling between two bond wires and their respective bond pads is shown in FIG. 3C. In this further drawing of completed work in the FIB chamber, IC chip 330 contains bond pads 332, 334 and their respective bond wires 336, 338. Bond wire 336 is attached to bond pad 332 by solder joint 340 and bond wire 338 is attached to bond pad 334 by solder joint 342. It was desired to couple bond wire 336 and bond pad 332 to bond wire 338 and bond pad 334. Due to the target resistance, two micro-wires were placed to form the coupling. In the embodiment shown, micro-wire 344 was attached to solder joint 340 and to solder joint 342 by welds 348. Micro-wire 346 was placed as an aerial coupling and is attached to bond wire 336 and bond wire 338 by welds 350, It is not always the case that the first and second conductive elements are in a position that allows a straight wire to form the connection. For example, a third conductive element may lie between the first and second conductive elements. Working with the FIB chemistries, an accidental connection to the third conductive element can only be avoided by first depositing a layer of dielectric over the third conductive element, followed by deposition of the desired connection. However, the dielectric deposited in the FIB can be leaky, allowing undesired leakage between the connection and the third conductive element, as well as taking a large amount of time. FIG. 2C depicts an element that can be added to method 200 in this situation. In this embodiment, the micro-wire segment can be shaped 265 to arch over the third conductive element between the first conductive element and the second conductive element without touching the third conductive element. In one embodiment, the shaping is done prior to positioning the micro-wire. In one embodiment, a first end of the micro-wire can be welded in place, followed by bending or otherwise shaping the micro-wire into a desired shape prior to welding the second end of the micro-wire.

Figures 4C, 4D, 4E:
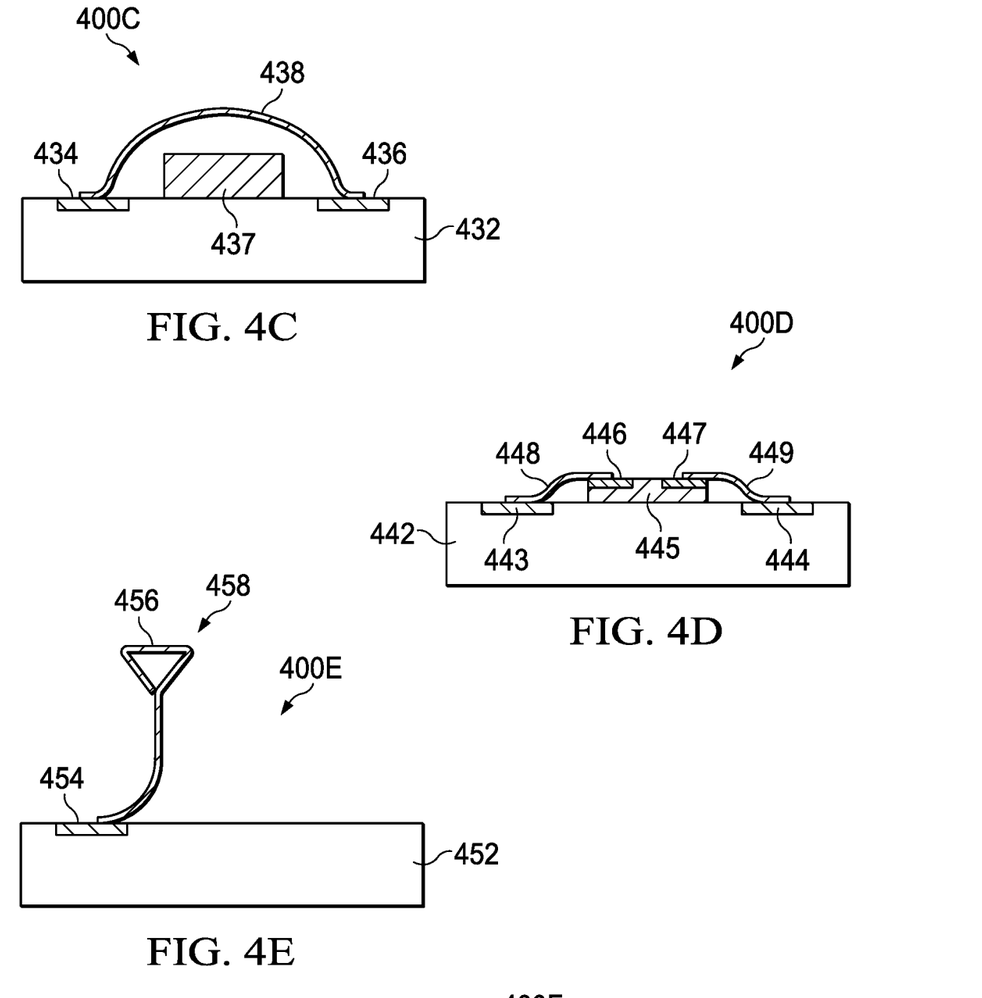
FIG. 4C depicts a micro-wire that couple two conductive elements while avoiding a third conductive element on an IC chip according to an embodiment of the disclosure.
FIG. 4D depicts a micro-wire that couple bond pads for a first IC chip and a second IC chip that are stacked according to an embodiment of the disclosure.
FIG. 4E depicts a micro-wire that has been shaped to form an antenna and attached to a conductive element on an IC chip according to an embodiment of the disclosure.

FIG. 4C depicts a cross-section of an IC chip 400C in which a first conductive element 434 and a second conductive element 436 are each embedded in the inter-level dielectric 432, while a third conductive element 437 lies on a direct path between first conductive element 434 and second conductive element 436. Micro-wire segment 438 has been bent or otherwise shaped to arch over the third conductive element 437, making contact with first conductive element 434 and second conductive element 436 without making any contact with third conductive element 437.

It is notable that there can be situations in which new capabilities provided by the use of micro-wires can be used not only during circuit edits, but also during the production of chips and chip packages. Micron-sized wires can be employed in the same processes that are done with larger wires, but with smaller features and greater precision. For example, current bond pads are generally in the range of 40-60 microns across and use bond wires that are 25-40 microns in diameter. If bond pads are 50 microns by 50 microns, a microarray would need to be hundreds of microns on a side to enable multiple connections. In contrast, by using micro-wires, smaller bond pads can be used, potentially allowing either less real estate used for the bond pads or else a larger number of bond pads in the same size package.

Figure 2D:
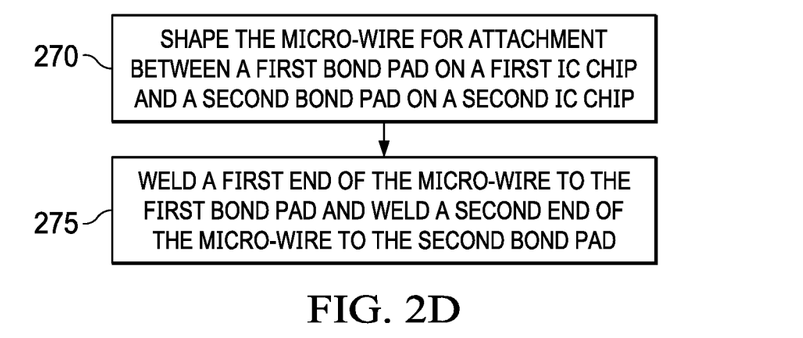

FIG. 2D depicts several elements that both add to and clarify method 200 when a second IC chip is mounted onto or in near proximity of a first IC chip, e.g., in a multichip module. Again, the micro-wire segment can be shaped 270 for attachment between a first bond pad on a first IC chip and a second bond pad on a second IC chip. Then the element of welding 225 the micro-wire segment into position is expanded to clarify that a first end of the micro-wire segment is welded 275 to the first bond pad and a second end of the micro-wire segment is welded to the second bond pad.

One example of this usage is depicted in FIG. 4D. Circuit package 400D includes a first IC chip 442, which has first bond pads 443, 444. A second IC chip 445 having second bond pads 446, 447 has been mounted on top of the first IC chip 442. Second IC chip 445 can be, e.g., an inductor, a capacitor, one or more sensors, a micro-array of active elements, passive elements, or any other circuit that is added to first IC chip 442, either during manufacture or post-manufacture. Micro-wire 448 has been shaped and attached to connect first bond pad 443 to second bond pad 446 and micro-wire 449 has been shaped and attached to connect first bond pad 444 to second bond pad 447.

Figure 2E:
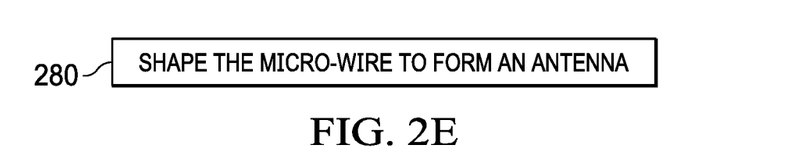

Because of the ductility of metal micro-wires, these micro-wires can be shaped to form additional elements that can be added to a circuit package, e.g., an IC chip or IC package. FIG. 2E provides an additional element for method 200 in which the micro-wire segment is shaped 280 to form an antenna. Once the micro-wire segment is shaped and attached to circuit package, communications can be performed using the antenna.

FIG. 4E depicts a cross-section of an IC chip 400E that includes a conductive element 454 embedded in ILD 452. Conductive element 454 can again be a bond pad or a contact in a metallization layer of interest, etc. A micro-wire 456 has been shaped to form an antenna 458, which is attached to conductive element 454 to provide communication capabilities. The length of the micro-wire 456 can be tuned to the desired frequency. Antenna 458 may, of course, take many different shapes from that illustrated in FIG. 4E.

Figure 2F:
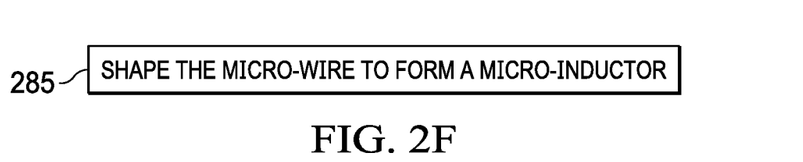
Figure 4F:
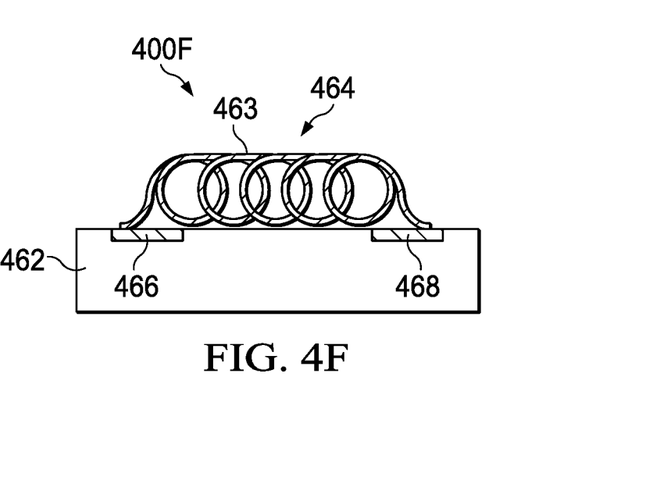
FIG. 4F depicts a micro-wire that has been shaped to form a micro-inductor and attached to conductive elements on an IC chip according to an embodiment of the disclosure.

FIG. 2F provides a further element that can be added to method 200 in which the micro-wire segment is shaped 285 to form a micro-inductor. Inductors are difficult to fabricate with semiconductor processing, as the inductors form large, challenging structures. Shaping a micro-wire into a micro-inductor that can be tacked to the IC chip provides an alternative fabrication method. FIG. 4F depicts IC chip 400F, which includes a first conductive element 466 and a second conductive element 468, which are embedded in ILD 462. A micro-wire 463 has been shaped to form a micro-inductor 464, which is attached to first conductive element 466 and to second conductive element 468. The diameter of the coils and the tightness of the coils can be adjusted to achieve the desired inductance.

The introduction of the disclosed micro-wires provides a bridge between the current capabilities in the fabrication of IC chips and the capabilities of the FIB. The fabrication and use of micro-wires can provide new capabilities that have previously been unavailable in circuit edit technologies, such as bridging between two raised elements, arching over intervening conductive elements and providing a connection capable to carrying larger currents. Micro-wires can also provide new methods of performing existing functions, such enabling smaller bond pads and providing antennae and micro-inductors, which can now be fabricated at a size that is a magnitude smaller. As IC chips and their associated packages continue to shrink in size, the disclosed use of micro-wires can open up further possibilities.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. An apparatus comprising:
    a multilayer structure including:
        a dielectric;
        a metal layer in the dielectric; and
        a first conductive element on or in the dielectric; and
    a preformed metal micro-wire having a first end coupled to the first conductive element, the preformed metal micro-wire having been fabricated before being coupled to the multilayer structure, and the preformed metal micro-wire having a diameter of 10 microns or less.

2. The apparatus of claim 1, wherein the preformed metal micro-wire is an antenna.

3. The apparatus of claim 1, wherein the multilayer structure further includes a second conductive element on or in the dielectric, and the preformed metal micro-wire has a second end coupled to the second conductive element.

4. The apparatus of claim 3, wherein the first conductive element and the second conductive element extend a height above a surface of the dielectric.

5. The apparatus of claim 3, wherein the multilayer structure includes a third conductive element on the dielectric between the first and second conductive elements, and the preformed metal micro-wire extends over the third conductive element with a gap between the preformed metal micro-wire and the third conductive element.

6. The apparatus of claim 2 further comprising an integrated circuit chip on a surface of the multilayer structure, the integrated circuit chip including a second conductive element, and wherein the preformed metal micro-wire has a second end coupled the second conductive element.

7. The apparatus of claim 3, wherein the preformed metal micro-wire is a micro-inductor.

* * * * *